US010518643B2

(12) United States Patent
Ebert et al.

(10) Patent No.: US 10,518,643 B2
(45) Date of Patent: Dec. 31, 2019

(54) MOTOR VEHICLE SUPPLY SYSTEM

(71) Applicant: LEONI BORDNETZ-SYSTEME GMBH, Kitzingen (DE)

(72) Inventors: Matthias Ebert, Dettelbach (DE); Markus Rau, Kitzingen (DE)

(73) Assignee: LEONI Bordnetz-Systeme GmbH, Kitzingen (DE)

( * ) Notice: Subject to any disclaimer, the term of this patent is extended or adjusted under 35 U.S.C. 154(b) by 303 days.

(21) Appl. No.: 15/591,660

(22) Filed: May 10, 2017

(65) Prior Publication Data

US 2017/0240049 A1 Aug. 24, 2017

Related U.S. Application Data

(63) Continuation of application No. PCT/EP2015/076146, filed on Nov. 10, 2015.

(30) Foreign Application Priority Data

Nov. 10, 2014 (DE) ........................ 10 2014 222 878

(51) Int. Cl.
*B60R 16/03* (2006.01)
*B60L 1/00* (2006.01)
(Continued)

(52) U.S. Cl.
CPC ................ *B60L 1/00* (2013.01); *B60R 16/03* (2013.01); *G01R 31/006* (2013.01); *G01R 31/025* (2013.01)

(58) Field of Classification Search
CPC .... B60R 16/03; G01R 31/025; G01R 31/006; B60L 1/00
See application file for complete search history.

(56) References Cited

U.S. PATENT DOCUMENTS 5,238,083 A * 8/1993 Horie .................... B60L 3/0007 180/274
6,037,749 A 3/2000 Parsonage
(Continued)

FOREIGN PATENT DOCUMENTS

CN 102243480 A 11/2011
CN 102822930 A 12/2012
(Continued)

*Primary Examiner* — Alfonso Perez Borroto
*Assistant Examiner* — Esayas G Yeshaw
(74) *Attorney, Agent, or Firm* — Laurence A. Greenberg; Werner H. Stemer; Ralph E. Locher

(57) ABSTRACT

A motor vehicle supply network, in particular a 48V on-board power supply of a motor vehicle, contains a current source, a power distributor connected to the current source via a supply current path, and at least one load connected to the power distributor via a load current path with an integrated semiconductor switch. A current-measuring unit, a voltage-measuring unit and a monitoring unit are integrated into the power distributor. The monitoring unit is configured in such a way that same detects an imminent fault based on the measurement data of the current-measuring unit and/or the measurement data of the voltage-measuring unit, and in such a way that same initiates a switching-off of the at least one load using the semiconductor switch. Both imminent over-current faults and imminent arc faults are detected as an imminent fault.

16 Claims, 2 Drawing Sheets

(51) Int. Cl.
*G01R 31/00* (2006.01)
*G01R 31/02* (2006.01)

(56) References Cited

U.S. PATENT DOCUMENTS

| | | | | |
|---|---|---|---|---|
| 8,346,377 | B2 | 1/2013 | Zushi et al. | |
| 2004/0070899 | A1* | 4/2004 | Gershen | H02H 3/331<br>361/42 |
| 2005/0138437 | A1* | 6/2005 | Allen | G06F 1/26<br>713/300 |
| 2011/0231119 | A1* | 9/2011 | Cohen | B60Q 1/143<br>702/56 |
| 2011/0276191 | A1* | 11/2011 | Zushi | G05B 9/02<br>700/293 |
| 2016/0356857 | A1* | 12/2016 | Kaupp | H04Q 9/00 |

FOREIGN PATENT DOCUMENTS

| | | | |
|---|---|---|---|
| DE | 10132952 | A1 | 1/2003 |
| DE | 10333674 | A1 | 2/2005 |
| DE | 1020006052318 | A1 | 5/2008 |
| DE | 102010053816 | A1 | 6/2012 |
| DE | 102012019996 | A1 | 4/2014 |
| DE | 102012023460 | A1 | 6/2014 |
| JP | 2011239550 | A | 11/2011 |
| WO | 9701103 | A1 | 1/1997 |

* cited by examiner

MOTOR VEHICLE SUPPLY SYSTEM

CROSS-REFERENCE TO RELATED APPLICATION

This is a continuation application, under 35 U.S.C. § 120, of copending international application No. PCT/EP2015/076146, filed Nov. 10, 2015, which designated the United States; this application also claims the priority, under 35 U.S.C. § 119, of German patent application No. DE 10 2014 222 878.6, filed Nov. 10, 2014; the prior applications are herewith incorporated by reference in their entirety.

BACKGROUND OF THE INVENTION

Field of the Invention

The invention relates to a motor vehicle supply system and particularly to a 48 V onboard electrical system of a motor vehicle.

Currently, motor vehicles are equipped with a DC supply system that is configured as what is known as a 12 V onboard electrical system and accordingly has one or more 12 V voltage sources. Since the number of electrical loads in a motor vehicle has recently risen significantly from vehicle generation to vehicle generation, however, the 12 V onboard electrical system is not regarded as viable for the future.

At present, the plans of many automobile manufacturers provide for the 12 V onboard electrical system to be superseded by a 48 V onboard electrical system, that is to say another DC supply system, that is to say for the basic voltage, system voltage or source voltage for the DC supply system of the motor vehicle to be raised from 12 V to 48 V. As already set out in the introduction of published, non-prosecuted German patent application DE 10 20 12 019 996 A1 originating from the applicant, such a raise in the basic voltage results in additional problems that need to be taken into consideration for the configuration of an applicable DC supply system.

Of particular relevance in this case is the increased risk of what are known as arcs forming that can lead to a cable fire and, as a result, also to a vehicle fire. Corresponding arcs arise in this case e.g. when a cable insulation is worn away at least locally by friction against an adjacent part or an adjacent assembly and, as a result, a conductor of the DC supply system is then exposed and is positioned close to an electrically conductive assembly, such as the vehicle skeleton. In such a case, a potential difference between the exposed conductor and the conductive assembly of just 15 V, for example, and a relatively low power transmission of approximately 50 watts via the exposed conductor is then sufficient for an arc to form between the exposed conductor and the electrically conductive assembly.

SUMMARY OF THE INVENTION

Against this background, the invention is based on the object of specifying an advantageously configured motor vehicle supply system.

A corresponding motor vehicle supply system is in this case configured particularly for a motor vehicle and, for this, preferably configured as a DC supply system and particularly as a 48 V onboard electrical system (48 volt onboard electrical system). It contains a current or voltage source and a power distributor that is connected to the current source via a supply current path in order to supply power from the current source, the applicable supply current path typically having at least sections formed by a power transmission cable, or cable for short. Further, the motor vehicle supply system contains at least one load, that is to say an electrical load, which is connected to the power distributor via a load current path with an integrated semiconductor switch in order to supply power from the power distributor. In this case, the load current path typically also has at least sections formed by a cable.

The load distributor in turn contains a current measuring unit, a voltage measuring unit and a monitoring unit, which are integrated in the power distributor and, by way of example, accommodated in a common housing or on a common printed circuit board. In this case, the monitoring unit is set up such that it identifies an imminent fault in the motor vehicle supply system and particularly in the load current path with the at least one load on the basis of the measurement data from the current measuring unit and/or the measurement data from the voltage measuring unit and subsequently initiates disconnection of the load by the semiconductor switch in the current path with the at least one load. Both imminent overcurrent faults and imminent arc faults are identified as an imminent fault.

The motor vehicle supply system represented here is therefore safeguarded against different faults, so that resultant consequential damage, particularly cable or vehicle fires, is avoided. The term fault is used in this application not for the occurrence of an error or defect that disturbs the operability of the DC distributor system but rather for the occurrence of an event or system state that is brought about by an error or a defect in the DC distributor system and is regarded as potentially problematic or critical.

As such, although, for example, the rise of the current level in a current path of the DC distributor system to a value above the rated current level, that is to say the envisaged current level, tends to be regarded as a system error or error, this error does not necessarily have to be rated as critical. Only if the current level is above the rated current level over a relatively long period or is very distinctly above the rated current level is a state reached that is potentially problematic for the DC distributor system, since there is then a significant risk of damage to individual assemblies or components of the motor vehicle supply system.

Similar differentiation is additionally carried out in the case of a cable fracture, for example. Although such a cable fracture is a defect, it is still not problematic or critical in itself. However, a cable fracture sometimes causes arcing in the region of the cable fracture, that is to say the formation of an arc that spans the fracture, so that the current flows through the current path again to the connected load. This very arc is regarded as potentially problematic or critical, since it can cause a cable and/or vehicle fire.

As a result, the protection system of the motor vehicle supply system and particularly the monitoring unit in the power distributor are preferably configured such that they react before a critical event actually occurs or a potentially problematic state is actually reached. This avoids consequential damage in the motor vehicle supply system or in the immediate surroundings, and the occurrence of arcs is prevented.

Further, the terms imminent overcurrent fault and imminent arc fault in this application represent different conditions or situations possible in principle to which the protection system is intended to react particularly by disconnecting the at least one load.

In this context, the term imminent overcurrent fault represents e.g. a rise of the current level on account of what is known as a short, as a result of which the current level in the relevant load current path rises to a multiple of the rated current level, that is to say more or less the envisaged current level. In this case, it is desirable for the relevant load current path to be isolated from the supply of energy as quickly as possible and hence for the at least one load to be disconnected, and the monitoring unit is accordingly set up such that, by way of example, switching-on of the semiconductor switch or switching-off of the semiconductor switch in the load current path with the at least one load is initiated by the monitoring unit as soon as the current measuring unit measures a value greater than twice the rated current level.

A relatively small transgression above the rated current level, for example up to twice the value, is, by contrast, rated and identified as an imminent overcurrent fault only if the current level in the relevant load current path remains above the rated current level over a prescribed period. Therefore, the monitoring unit is preferably set up such that it initiates switching-on or switching-off of the semiconductor switch in the relevant load current path only if the current level remains above the rated current level for at least 10 s, for example. This allows for the fact that, in principle, fluctuations in the current level can arise in a DC voltage supply system, which means that the current level in a current path of the motor vehicle supply system is intermittently above the actually envisaged value, that is to say the rated current level. Provided that such a transgression above the rated current level does not end up too great, however, and lasts only over a limited period, the risk of resultant damage to an assembly of the motor vehicle supply system and particularly to the at least one load can be classified as low, and accordingly the monitoring unit is preferably configured such that a brief transgression above the rated current level is tolerated so long as the current level does not exceed a prescribed limit value that is regarded as an indication of a short. That is to say that the monitoring unit is used not only to identify or detect the two typical imminent overcurrent faults that are possible in principle as imminent faults but rather preferably also to identify or ascertain the nature of the imminent overcurrent fault, so that it is then possible to react to different imminent faults e.g. in a differentiated fashion.

This applies not only to the imminent overcurrent faults but furthermore also to the imminent arc faults, however, wherein, depending on the variant embodiment of the motor vehicle supply system and particularly depending on the configuration of the monitoring unit, it is simply the case that different imminent faults are either merely detected or else additionally identified. This allows matching to different intended uses, and the resultant design freedom is preferably also used. In the simplest case, the monitoring unit is then configured such that the most widely differing imminent faults possible in principle, or at least those that are regarded as particularly relevant, are detected, that is to say identified, without differentiating the different imminent faults, that is to say without identifying precisely which fault will imminently occur. In this case, the same reaction by the system, that is to say particularly the switching-on or switching-off of the semiconductor switch in the current path for the at least one load, is then accordingly produced regardless of the nature of the imminent fault, with the monitoring unit either actuating the applicable semiconductor switch directly via an applicable connection between the semiconductor switch and the monitoring unit or initiating corresponding actuation, e.g. by transmitting a type of trigger signal to an output stage or amplifier stage that is used to actuate the semiconductor switch.

In this case, the term imminent arc fault typically also covers various potentially possible imminent faults, some of which are described in published, non-prosecuted German patent application DE 10 20 12 019 996 A1. In contrast to the overcurrent faults, the associated faults are distinguished in that they can lead to the appearance or formation of arcs, that is to say in principle to the production of a plasma. These arcs are not only undesirable in this case, but furthermore potentially problematic, since, as set out at the outset, they can cause cable fires or even vehicle fires.

In this case, the general risk of arcs is greater the higher the voltage provided in the motor vehicle supply system and the higher the power routed via a current path. For this reason, motor vehicle supply systems are preferably provided with an integrated safety system, presented here, for which a source voltage or system voltage of greater than 20 volts is provided, that is to say which incorporates at least one voltage source having a supply voltage of greater than 20 volts. As a further preference, a corresponding configuration is provided for motor vehicle supply systems that have at least one current path and particularly a load current path, via which more than 300 watts and particularly more than 500 watts, that is to say approximately 1000 watts, for example, for supplying power to a load, that is to say an electrical load, are routed at least intermittently during operation. In the case of such motor vehicle supply systems, the risk of corresponding arcs is regarded as not insignificant and accordingly these motor vehicle supply systems are safeguarded not only against overcurrents but also against arcs.

Further, all or at least the essential functional elements used for monitoring and hence for safeguarding the motor vehicle supply system are preferably part of the power distributor and hence part of a single modular unit prefabricated for the manufacture of the motor vehicle supply system, depending on the variant embodiment. In this case, it should be borne in mind that onboard electrical systems for motor vehicles are today frequently manufactured using a limited number of prefabricated modular units, for example, the prefabricated modular units being combined with one another in different ways according to the construction kit principle in order to produce different onboard electrical system variants or onboard electrical system versions. By integrating the functional units provided for safeguarding into the power distributor, that is to say a prefabricated modular unit that is provided anyway, it is possible to dispense with an additional construction kit module or an additional prefabricated modular unit for the functional elements for safeguarding the motor vehicle supply system. In this case, preferably at least the essential functional units, that is to say the current measuring unit, the voltage measuring unit and the monitoring unit, are accommodated e.g. in a common housing, the housing of the power distributor, and/or implemented on a common printed circuit board.

Expediently, the power distributor is additionally normally configured such that the supply current path in the power distributor is more or less split into multiple load current paths, with a load being connected to the power distributor via each of these load current paths. Accordingly, entirely in line with the term power distributor, the electric power provided by the current source is then distributed in the power distributor to the various connected loads as required, so that each load is supplied with sufficient power when needed. In this case, a separate semiconductor switch is preferably integrated in each load current path and each load current path is monitored for faults. Depending on the configuration variant, a separate current measuring unit and/or a separate voltage measuring unit are also provided for each load current path in this case and are used to allow load-current-path-dependent current and voltage measurements. For monitoring the applicable measured values, on the other hand, there is preferably only a single monitoring unit provided and accordingly accommodated in the power distributor. That is to say that preferably all load current paths leaving the power distributor are monitored by a single monitoring unit by virtue of this monitoring unit evaluating the measurement data from all current measuring units and all voltage measuring units.

In this case, the monitoring unit is expediently additionally configured such that it identifies not only an imminent fault, that is to say an imminent overcurrent fault or an imminent arc fault, but furthermore also the load current path in which the fault is imminent, in which case merely the load of the relevant load current path is disconnected by virtue of the switching-on or switching-off of the applicable semiconductor switch being initiated by the monitoring unit.

Further, according to one advantageous configuration, the semiconductor switch is in the form of a power transistor and particularly in the form of a MOSFET, which is to say in the form of a metal oxide semiconductor field effect transistor. MOSFETs can easily be designed for high powers of up to several 100 A and up to approximately 1000 V (power MOSFET) and are at the same time distinguished by short switching times, which means that such transistors are basically well suited to implementing protective switches or fuse switches for safeguarding a motor vehicle supply system.

In addition, integrated circuits can easily be constructed using corresponding power transistors or MOSFETs, which means that it is also possible for semiconductor switches or fuse switches having additional functions to be manufactured and used in the motor vehicle supply system, for example. That is to say that the semiconductor switch is not necessarily provided by a single transistor, but rather may also be of more complex design, and is of more complex design, depending on the intended use. As such, it is advantageous, inter alia, if such a semiconductor switch has a current measuring unit integrated in it that measures the current level of the current flowing into a load current path via the semiconductor switch. As an example of such a semiconductor switch having additional functions, reference may be made at this juncture to the series or product line PROFET™ from the Infineon company.

In a preferred configuration, a common printed circuit board for each of the loads has a respective semiconductor switch, a respective current measuring unit, a respective voltage measuring unit and a monitoring unit arranged on it, the monitoring unit being common to all loads. All of the elements for monitoring are therefore integrated compactly on a common printed circuit board, at least in a common component (power distributor). The input side of the latter now needs to be connected only to the current source, and its output side needs to have multiple connections (e.g. plug connections) for the individual load paths.

Additionally, the monitoring unit is expediently a universal monitoring unit that is used to monitor multiple potential faults. As such, the monitoring unit is preferably designed to record:

a) an overcurrent,
b) a short from the load current path to ground,
c) a parallel arc in the load current path,
d) a serial arc in the load current path and to record, and
e) a serial arc in a ground path between the respective load and a ground potential for each of the individual loads.

The monitoring unit is preferably configured to identify not only the widest variety of imminent faults but furthermore also what kind of imminent fault is involved, that is to say what type of fault will imminently occur. In this case, as a further preference, not only is a distinction drawn between imminent overcurrent faults and imminent arc faults, but rather further differentiation normally takes place, that is to say, inter alia, differentiation between an imminent overcurrent fault on account of a short and an imminent overcurrent fault in which the current level is greater than the rated current level and less than twice the rated current level, for example, over a relatively long period.

The monitoring unit is also preferably designed to distinguish between different imminent arc faults, which is to say particularly between an imminent "serial" arc fault and an imminent "parallel" arc fault. In this case, an imminent serial arc fault is referred to, for example, when there is a cable fracture or wire fracture, or the conductivity is significantly lowered more or less at points for some other reason, in a section of a load current path that is formed by a conductor wire or a cable. In this case, the flow of current is then interrupted or at least severely reduced in the region of the cable fracture or wire fracture, which leads to charge congestion and hence to a relatively high potential difference over a relatively short distance. If the charge congestion is sufficiently high, an arc then forms that spans the fracture or the defective section, so that current flows in turn more or less serially along the current path to the load. The occurrence of the arc can be equated with the occurrence of the serial arc fault in this case.

By contrast, a parallel arc fault is referred to when at least a portion of the current drains via an arc from the load current path to another current path or simply a charge carrier sink. This happens, for example, when, as already set out at the outset, the insulation of a cable is damaged and a conductor beneath it is then exposed at least in sections and is positioned at a relatively short distance from a conductive structure, such as a vehicle body, for example. In this case, the vehicle body or the vehicle skeleton then acts as ground or a ground connection and hence as a charge carrier sink for the power-transmitting load current path.

If the monitoring unit is now configured for differentiation or differentiated identification of different imminent faults, then this information can be used in different ways. As already stated above, there is provision in this case, for example, for the DC distributor system to be configured such that different imminent faults also result in different reactions, that is to say that, for example, the monitoring unit is set up such that it initiates disconnection of semiconductor switches either immediately after a current value larger than the rated current value is identified or else with a prescribed time delay, depending on the imminent fault.

As an alternative or in addition, this information can be transmitted to an external receiver not arranged in the power distributor, which is to say to a controller in the onboard electrical system of the motor vehicle, for example. In this case, the information is then added to an error log, for example, and stored together with the error log in an error memory, so that a service engineer who reads the error memory during servicing is advised of the applicable error and of details relating to the error. As an alternative or in addition, an applicable data transmission to the controller triggers the generation of a warning signal by the controller that provides the vehicle driver of the motor vehicle with a visual and/or audible indication of there being a problem and of the fact that it is advisable or necessary to go to a garage. If there is provision for such data transmission to an external receiver, the monitoring unit preferably has a communication unit for this purpose that is set up such that identification of an imminent fault prompts a fault log, generated in the communication unit, to be output via a signal output on the power distributor and, if connected, transmitted to an external receiver.

In some instances of application, the applicable information is moreover additionally used to actuate a display element, particularly a control display, on the basis of said information. The applicable display is in this case integrated in a housing of the power distributor or fitted on a housing of the power distributor, for example, and is thus used to assist a service engineer in searching for the relevant part, which is advantageous particularly when there are multiple such power distributors installed in a motor vehicle.

In order to allow appropriate differentiation between different imminent faults, the monitoring unit is advantageously configured such that the measurement data generated by the current measuring unit and/or by the voltage measuring unit are compared with stored current and/or voltage profiles that are characteristic of particular faults. In this context, a profile is intended to be understood to mean the time profile of a current or voltage value, that is to say the trend in a current or voltage value over time, before and on the occurrence of a fault. In this case, the time profile does not just reveal when there is a fault, but rather it is also possible to make out a looming or imminent fault, and as a result to react before the fault actually occurs.

In the case of the imminent serial arc fault described above, the occurrence of an arc is considered to be a serial arc fault that needs to be prevented. Before a corresponding arc forms, however, the current and/or voltage values themselves for the relevant load current path are altered in the characteristic manner and this change can be identified by comparing the measured values or rather by comparing the trend in the measured values over time with a stored measured value profile.

Whereas the current measuring unit provided for a load current path is, as described above, preferably integrated in the semiconductor switch of the applicable load current path, the voltage measuring unit associated with this load current path is preferably part of a measuring bridge, that is to say is used to record a potential difference in a measuring bridge with a bridge head in the region of the load of the applicable load current path and with a bridge head in the region of the semiconductor switch of this load current path. In this case, all assemblies or components that are used for implementing monitoring and safeguarding of the applicable load current path, with the exception of the bridge head in the region of the load, are then part of the power distributor and accordingly accommodated in the power distributor. In this case, the measuring bridge is, as a further preference, configured in the manner of what is known as a Wheatstone measuring bridge, that is to say is based on the principle of the known Wheatstone measuring bridge. In this case, a voltage measurement or voltage monitoring is then performed, as described in published, non-prosecuted German patent application DE 10 2012 019 996 A1, which is why express reference is made to the whole disclosure of this laid-open specification at this juncture.

As set out in the laid-open specification, the measuring bridge in this case typically contains a sensor line or signal line that connects the bridge head in the region of the load to the voltage measuring unit in the power distributor. In this case, the sensor line has at least one section formed by a core or a shield of a power transmission cable, the other cores or the conductor of which form(s) the load current path in this very section.

As a further preference, the bridge head in the region of the load is configured as in the second exemplary embodiment of published, non-prosecuted German patent application DE 10 2012 019 996 A1 and accordingly contains a bypass line that taps the load current path with which the bridge head is associated upstream and downstream of the load and that has two resistors connected in series in it. In this case, the sensor line is used to tap off the potential between the two series-connected resistors and to compare it with a potential in the additional bridge head. In this case, it is advantageous for the bridge head in the region of the load to be integrated into a plug connector of a power transmission cable that connects the load to the power distributor.

The combination of the bridge head integrated in a plug connector with the sensor line integrated in the load current path (separate core or shield) in conjunction with the common monitoring component (power distributor) in or on which all of the required elements for monitoring are integrated has the particular advantage that all of the measures for line monitoring can actually be provided in advance universally without the need for further complex production measures.

Other features which are considered as characteristic for the invention are set forth in the appended claims.

Although the invention is illustrated and described herein as embodied in a motor vehicle supply system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
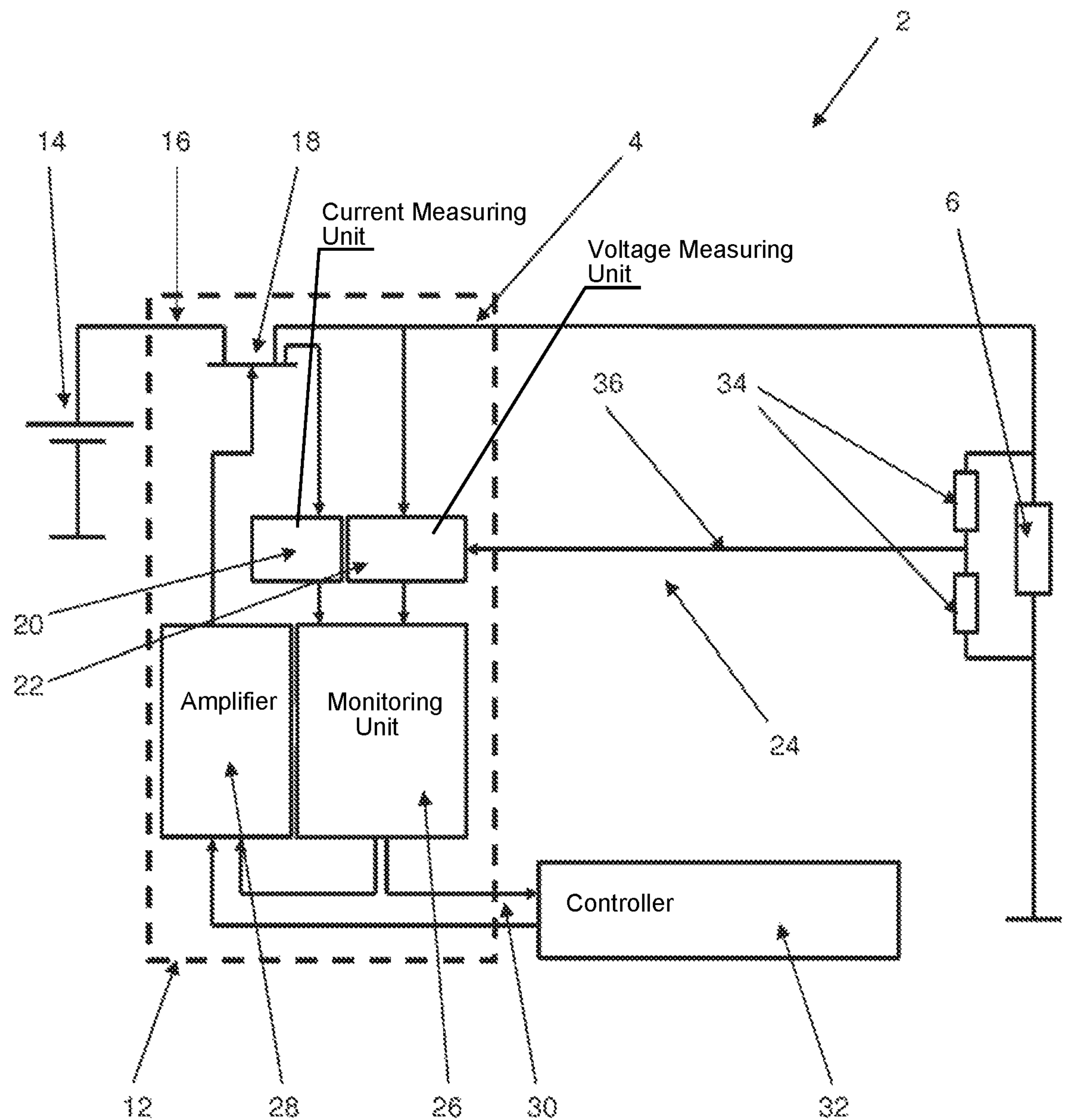
FIG. 1 is a block diagram of a DC distributor system according to the invention.

Mutually corresponding parts are provided with the same reference symbols in each case in all the figures.

Referring now to the figures of the drawings in detail and first, particularly to FIGS. 1 and 2 thereof, there is shown a motor vehicle supply system 2 that is described by way of example below and represented in FIG. 2 has multiple load current paths 4 via which a respective connected load 6 is supplied with electric power when required. In this case, each load 6 is connected to a power distributor 12 by a cable 8 that has a respective connection element in the form of a plug 10 at both ends, so that each load current path 4 has at least sections formed by the cable 8.

The power distributor 12 in turn is connected to a current source 14 that provides electric power in the motor vehicle supply system 2 and, to this end, supplies it to the power distributor 12. In the power distributor 12, a supply current path 16, via which the power distributor 12 is connected to the current source 14 and via which electric power from the current source 14 reaches the power distributor 12, then splits into the load current paths 4, via which the loads 6 are supplied with electric power more or less as end consumers. In this case, the power requirement is between 500 W and 1500 W, depending on the load 6, and accordingly the motor vehicle supply system 2 is configured to supply electrical loads with a relatively high power requirement.

Further, the motor vehicle supply system 2 in the exemplary embodiment described here is configured for a motor vehicle and has a safety system that is used to safeguard the motor vehicle supply system 2 both against overcurrent faults and against arc faults and hence resultant consequential damage. In this case, the safety system is configured such that each load current path 4 is monitored and that the load 6 supplied with power via a load current path 4 is cutoff from the supply as soon as an imminent fault is identified in the applicable load current path 4.

The basic principle of the monitoring is explained below with reference to the simplified motor vehicle supply system 2 depicted in FIG. 1, which contains merely the load current path 4 and accordingly the load 6. This basic principle can easily be transferred to multiple load current paths 4 and accordingly multiple loads 6, however, and hence also applied for the motor vehicle supply system 2 shown in FIG. 2.

Figure 2:
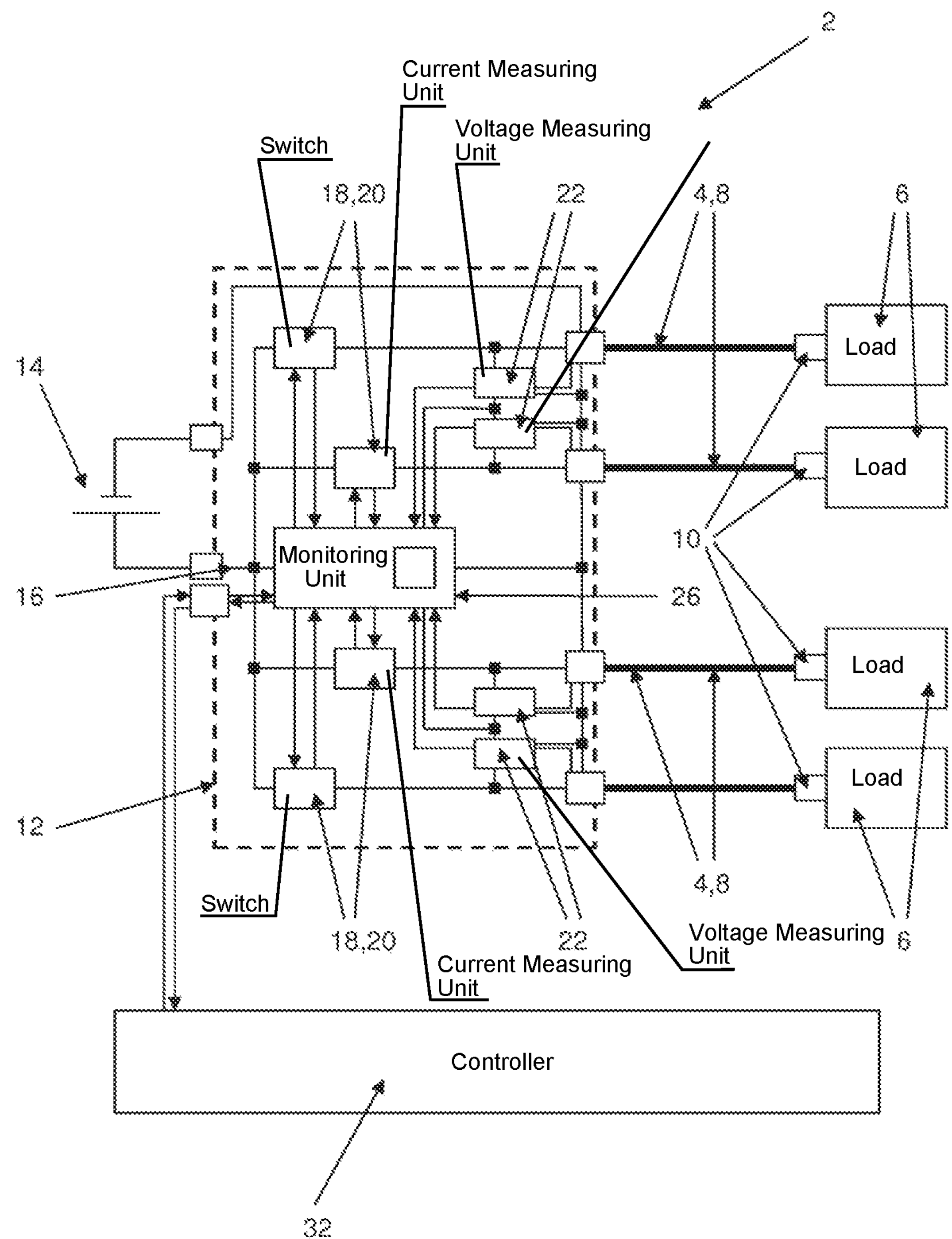
FIG. 2 is a block diagram of an alternative DC distributor system.

To monitor the load current path 4 and hence to implement the safety system of the motor vehicle supply system 2, the power distributor 12, which is marked by a dashed border in FIG. 1 and also in FIG. 2, has multiple functional units or functional modules that, in the exemplary embodiment, are accommodated on a common printed circuit board and surrounded by a common housing.

One functional unit is provided by a semiconductor switch 18 that, when an imminent fault is identified, is switched on or switched off in order to decouple the load 6 from the supply of electric power, that is to say in order to disconnect the electrical load supplied with power via the applicable load current path 4. In this case, the semiconductor switch 18 is integrated in the applicable load current path 4 and is additionally used to switch the applicable electrical load on and off as required.

As a further functional unit, the power distributor 12 has a current measuring unit 20 that is used to monitor the current flowing via the load current path 4 by recording the current level. To this end, the current measuring unit 20 is connected directly to a current measurement output on the semiconductor switch 18 for signaling purposes or else the current measuring unit 20 is integrated completely in the semiconductor switch 18.

In addition to the current measuring unit 20, the power distributor 12 contains a voltage measuring unit 22, which is incorporated in a voltage measuring bridge, only part of which is depicted in FIG. 1. The voltage measuring bridge is based on the principle of a Wheatstone measuring bridge and is already described in published, non-prosecuted German patent application DE 10 2012 019 996 A1 originating from the applicant, which is why express reference is made to this laid-open specification again at this juncture.

In this case, both the current measuring unit 20 and the voltage measuring unit 22 along with the voltage measuring bridge 24 are used merely for recording a current level and a voltage, whereas the recorded measurement data, particularly the time profile of the recorded current level and the time profile of the recorded voltage, are evaluated in a monitoring unit 26 that, as a further functional unit of the safety system, is part of the power distributor 12. In the monitoring unit 26, the current level recorded by the current measuring unit 20 is then compared with multiple current profiles stored in a memory of the monitoring unit 26 that represent a characteristic time profile of the current level before and on the occurrence of a fault, which means that an imminent fault can be inferred during measurement of a comparable time profile to the current level recorded by means of the current measuring unit 20. A similar evaluation of the measurement data from the voltage measuring unit 22 is effected in parallel, multiple voltage profiles in turn being stored in the memory of the monitoring unit 26 for this too.

In this case, the monitoring unit 26 is configured such that the identification of imminent overcurrent faults is identified solely on the occurrence of a characteristic time profile for the current level in the load current path 4, whereas the imminent arc faults are identified when both a characteristic time profile for the current level and a characteristic time profile for the voltage recorded by means of the voltage measuring unit 22 are ascertained. In this way, different types of imminent faults are then identified as imminent faults, wherein, regardless of the nature of the imminent fault, a reaction from the monitoring unit 26 is obtained such that it initiates the switching-on or switching-off of the semiconductor switch 18, and to this end transmits a control signal to an amplifier 28.

Additionally, when an imminent fault occurs, a fault log is generated in the monitoring unit 26 and transmitted to an external receiver, in the exemplary embodiment a controller 32 in the onboard electrical system of the motor vehicle, via a signal output 30 on the power distributor 12. In the controller 32, the fault log is then incorporated into an error log and stored in an error memory that is typically read by a service engineer in the course of servicing of the motor vehicle. As a result, the service engineer is then advised of the problem that is present.

In the case of the motor vehicle supply system 2 shown in FIG. 2, the service engineer is not just made aware of the presence of a problem by the error log in the error memory, the error log furthermore also contains the information concerning the load current path 4 of the motor vehicle supply system 2 in which the applicable problem is present. Apart from that, the individual load current paths 4 of the motor vehicle supply system 2 shown in FIG. 2 are monitored according to the same principle as in the case of the motor vehicle supply system 2 shown in FIG. 1, wherein a separate semiconductor switch 18, a separate current measuring unit 20 and a separate voltage measuring bridge 24 with an incorporated voltage measuring unit 22 are provided and accordingly implemented in the power distributor 12 for each load current path 4.

By contrast, the measurement data associated with the individual load current paths 4 are evaluated in a single monitoring unit 26, which is accordingly connected to all current measuring units 20 and all voltage measuring units 22 in the power distributor 12. When an imminent fault occurs in one of the load current paths 4, the one monitoring unit 26 actuates the semiconductor switch 18 associated with the applicable load current path 4, as a result of which the applicable load current path 4 is isolated from the power supply. In this case, the actuation in the exemplary embodiment shown in FIG. 2 is effected directly by the monitoring unit 26, which is configured in the manner of a microcontroller and has an integrated signal amplifier for actuating the semiconductor switches 18 in the power distributor 12. The actuation of the semiconductor switches 18 in the power distributor 12 as required, that is to say the switching of the electrical loads on and off, is also effected in the motor vehicle supply system shown in FIG. 2 by the monitoring unit 26, the applicable actuation of the semiconductor switches 18 being effected on the basis of control signals that are transmitted to the monitoring unit 26 via the controller 32.

FIG. 1 also portrays two resistors 34, depicted in the region of the load 6, and a sensor line or signal line 36, which are part of the voltage measuring bridge 24 and not depicted explicitly in FIG. 2, but are implemented for each load current path 4 in the motor vehicle supply system 2. The applicable resistors 34 are in this case each integrated in the load-side plug 10 of each cable 8, and the signal line 36 is provided either by an additional core in each cable 8 or by a shield in each cable 8.

The invention is not restricted to the exemplary embodiment described above. Rather, other variants of the invention can also be derived therefrom by a person skilled in the art without departing from the subject matter of the invention. In particular, all individual features described in connection with the exemplary embodiment are further also combinable with one another in a different manner without departing from the subject matter of the invention.

The following is a summary list of reference numerals and the corresponding structure used in the above description of the invention:

2 Motor vehicle supply system
4 Load current path
6 Load
8 Cable
10 Plug
12 Power distributor
14 Current source
16 Supply current path
18 Semiconductor switch
20 Current measuring unit
22 Voltage measuring unit
24 Voltage measuring bridge
26 Monitoring unit
28 Amplifier
30 Signal output
32 Controller
34 Resistor
36 Signal line

The invention claimed is:

1. A motor vehicle supply system, comprising:
a current source;
a supply current path;
a power distributor connected to said current source via said supply current path;
a load current path;
an integrated semiconductor switch;
at least one load connected to said power distributor via said load current path and said integrated semiconductor switch, said at least one load further connected to said current source via said power distributor;
a current measuring unit integrated in said power distributor;
a voltage measuring unit integrated in said power distributor; and
a monitoring unit integrated in said power distributor, said monitoring unit being set up such that said monitoring unit identifies an imminent fault on a basis of measurement data from said current measuring unit and/or measurement data from said voltage measuring unit and that said monitoring unit initiating a disconnection of said at least one load by means of said integrated semiconductor switch, wherein both imminent overcurrent faults and imminent arc faults are identified as the imminent fault.

2. The motor vehicle supply system according to claim 1, wherein:
said load current path is one of a plurality of load current paths;
said integrated semiconductor switch is one of a plurality of integrated semiconductor switches;
said at least one load is one of a plurality of loads each connected to said power distributor via a separate one of said load current paths with one of said integrated semiconductor switches; and
said monitoring unit is set up to monitor all of said load current paths independently of one another, so that in an event of a fault in one of said load current paths, only said load connected thereto is disconnected.

3. The motor vehicle supply system according to claim 1, wherein at least said integrated semiconductor switch is integrated in said load current path with said at least one load and said integrated semiconductor switch is a power transistor.

4. The motor vehicle supply system according to claim 2,
wherein said current measuring unit is one of a plurality of current measuring units;
wherein said voltage measuring unit is one of a plurality of voltage measuring units;
further comprising a common printed circuit board having each of said loads, said integrated semiconductor switches, said current measuring units, said voltage measuring units and said monitoring unit disposed on it, said monitoring unit being common to all of said loads and configured to record:
a) an overcurrent;
b) a short from any of said load current paths to ground;
c) a parallel arc in any of said load current paths;
d) a serial arc in any of said load current paths; and
e) a serial arc in a ground path between a respective load and a ground potential for each of said loads.

5. The motor vehicle supply system according to claim 1, wherein said current measuring unit, in order to monitor said load current path with said at least one load, is integrated in said integrated semiconductor switch of an applicable load current path.

6. The motor vehicle supply system according to claim 1, wherein said monitoring unit is set up to identify the imminent fault and a nature of the imminent fault.

7. The motor vehicle supply system according to claim 1, wherein said monitoring unit is set up to identify the imminent fault and a nature of the imminent fault by collating the measurement data from said current measuring unit and/or the measurement data from said voltage measuring unit with stored current and/or voltage profiles.

8. The motor vehicle supply system according to claim 6, wherein said power distributor has a signal output and said monitoring unit is set up such that a fault log is generated and transmitted to a receiver via said signal output on said power distributor when the imminent fault has been identified.

9. The motor vehicle supply system according to claim 1, further comprising a measuring bridge with a bridge head, said monitoring unit identifying imminent arc faults in said load current path by monitoring a potential difference, recorded by means of said voltage measuring unit, in said measuring bridge with said bridge head in a region of said load of said load current path and with said bridge head in a region of said integrated semiconductor switch of said load current path.

10. The motor vehicle supply system according to claim 9, wherein said measuring bridge is based on a principle of a Wheatstone measuring bridge.

11. The motor vehicle supply system according to claim 9, further comprising a sensor line being routed from said bridge head in a region of said load to said power distributor, said sensor line having at least one section formed by a core or a shield of a power transmission cable that connects said load to said power distributor.

12. The motor vehicle supply system according to claim 9, further comprising a power transmission cable having a plug connector, said bridge head in said region of said load is integrated in said plug connector of said power transmission cable that connects said load to said power distributor.

13. The motor vehicle supply system according to claim 1, wherein the motor vehicle supply system is a 48 V onboard electrical system of a motor vehicle.

14. The motor vehicle supply system according to claim 3, wherein said power transistor is a MOSFET.

15. A motor vehicle supply system, comprising:

a current source;

a supply current path;

a power distributor connected to said current source via said supply current path;

a plurality of load current paths;

a plurality of integrated semiconductor switches;

a plurality of loads each connected to said power distributor via a separate one of said load current paths with one of said integrated semiconductor switches, said loads are each further connected to said current source via said power distributor;

current measuring units integrated in said power distributor;

voltage measuring units integrated in said power distributor;

a monitoring unit integrated in said power distributor, said monitoring unit being set up such that said monitoring unit identifies an imminent fault on a basis of measurement data from said current measuring units and/or measurement data from said voltage measuring units and that said monitoring unit initiating a disconnection of a respective one of said loads by means of said integrated semiconductor switches, wherein both imminent overcurrent faults and imminent arc faults are identified as the imminent fault;

said monitoring unit being set up to monitor all of said load current paths independently of one another, so that in an event of a fault in one of said load current paths, only said respective load connected thereto is disconnected;

a common printed circuit board having each of said loads, said integrated semiconductor switches, said current measuring units, said voltage measuring units and said monitoring unit disposed on it, said monitoring unit being common to all said loads and configured to record:

a) an overcurrent;

b) a short from any of said load current paths to ground;

c) a parallel arc in any of said load current paths;

d) a serial arc in any of said load current paths; and e) a serial arc in a ground path between said respective load and a ground potential for each of said loads;

a measuring bridge with a bridge head, said monitoring unit identifying imminent arc faults in said load current paths by monitoring a potential difference, recorded by means of said voltage measuring units, in said measuring bridge with said bridge head in a region of said loads of said load current paths and with said bridge head in a region of said integrated semiconductor switches of said load current paths; and power transmission cables each having a plug connector, said bridge head in said region of said loads is integrated in said plug connector of said power transmission cables that connects said loads to said power distributor.

16. A power distributor for a motor vehicle supply system having a current source, the power distributor comprising:

a load current path;

an integrated semiconductor switch;

at least one load connected to said integrated semiconductor switch via said load current path, said integrated semiconductor switch configured for connecting to the current source of the motor vehicle supply system for connecting said load to the current source via the power distributor;

a current measuring unit;

a voltage measuring unit; and a monitoring unit connected to said current measuring unit, said integrated semiconductor switch and said voltage measuring unit, said monitoring unit being set up such that said monitoring unit identifies an imminent fault on a basis of measurement data from said current measuring unit and/or measurement data from said voltage measuring unit and that said monitoring unit initiating a disconnection of said at least one load by means of said integrated semiconductor switch, wherein both imminent overcurrent faults and imminent arc faults are identified as the imminent fault.

* * * * *